(12) United States Patent
Hayashida et al.

(10) Patent No.: US 11,889,635 B2
(45) Date of Patent: Jan. 30, 2024

(54) JOINED BODY OF JOINING BASE MATERIAL AND METAL LAYER

(71) Applicant: WORLD METAL CO., LTD., Osaka (JP)

(72) Inventors: Hidenori Hayashida, Osaka (JP);
Hideyuki Matsuo, Osaka (JP);
Yukihisa Hiroyama, Osaka (JP);
Hiroyuki Hayashida, Osaka (JP)

(73) Assignee: WORLD METAL CO., LTD, Osaka (JP)

(*) Notice: Subject to any disclaimer, the term of this patent is extended or adjusted under 35 U.S.C. 154(b) by 16 days.

(21) Appl. No.: 17/624,302

(22) PCT Filed: Apr. 3, 2020

(86) PCT No.: PCT/JP2020/015324
§ 371 (c)(1),
(2) Date: Dec. 31, 2021

(87) PCT Pub. No.: WO2021/005852
PCT Pub. Date: Jan. 14, 2021

(65) Prior Publication Data
US 2022/0279661 A1    Sep. 1, 2022

(30) Foreign Application Priority Data
Jul. 8, 2019 (JP) .................. 2019-127120

(51) Int. Cl.
*H05K 3/38* (2006.01)
*H05K 3/18* (2006.01)

(52) U.S. Cl.
CPC ............ *H05K 3/384* (2013.01); *H05K 3/188* (2013.01); *H05K 3/388* (2013.01); *Y10T 428/12056* (2015.01)

(58) Field of Classification Search
None
See application file for complete search history.

(56) References Cited

U.S. PATENT DOCUMENTS

| 3,766,634 A | 10/1973 | Babcock et al. |
| 3,994,430 A | 11/1976 | Cusano et al. |

(Continued)

FOREIGN PATENT DOCUMENTS

| CN | 104742309 A * | 7/2015 |
| JP | S61-58296 | 3/1986 |

(Continued)

OTHER PUBLICATIONS

International Search Report and Written Opinion for PCT/JP2020/015324, filed Apr. 3, 2020.

(Continued)

*Primary Examiner* — Seth Dumbris
(74) *Attorney, Agent, or Firm* — Paul D. Bianco; Fleit Intellectual Property Law

(57) ABSTRACT

A joined body of a joining base material and a metal layer which, when the metal layer is joined to the base material, adhesion of the metal layer is high, variation in adhesion is small, and the joining can be performed inexpensively. The metal layer is joined to the joining base material via an intermediate layer coating formed on a joint surface of the base material. The intermediate layer coating is fused to the joint surface of the base material, and an anchor forming material that joins the metal layer by an anchor effect is dispersed and embedded in the intermediate layer coating; the anchor forming material partially protrudes outward from the intermediate layer coating, and is fused to the intermediate layer coating; and the metal layer is joined to (Continued)

a surface of the intermediate layer coating and a surface of the anchor forming material protruding outward from the intermediate layer coating.

11 Claims, 1 Drawing Sheet

(56) References Cited

U.S. PATENT DOCUMENTS

| | | | |
|---|---|---|---|
| 2007/0065639 A1 | 3/2007 | Iida | |
| 2008/0193742 A1* | 8/2008 | Maeda | H05K 3/38 428/323 |
| 2019/0090357 A1 | 3/2019 | Ito | |

FOREIGN PATENT DOCUMENTS

| | | | |
|---|---|---|---|
| JP | S61-170094 | 7/1986 | |
| JP | H1-181499 | 7/1989 | |
| JP | H3-2833 | 1/1991 | |
| JP | 2778143 | 5/1998 | |
| JP | 2007-87979 | 4/2007 | |
| JP | 2018-48382 | 3/2018 | |
| WO | 2017/159024 | 9/2017 | |
| WO | WO-2018056145 A1 * | 3/2018 | ............. B32B 15/01 |

OTHER PUBLICATIONS

International Preliminary Report on Patentability dated Jan. 11, 2022, with Written Opinion, for PCT/JP2020/015324, filed Apr. 3, 2020 (English translation).

* cited by examiner

JOINED BODY OF JOINING BASE MATERIAL AND METAL LAYER

FIELD

The present invention relates to a joined (bonded) body of a joining (bonding) base material and a metal layer, and more specifically relates to a joined body of a joining base material and a metal layer in which the metal layer with good adhesion is joined to a surface of the joining base material.

BACKGROUND

As a conventional technique for joining a metal layer to a base material such as ceramic, there is a well-known technique by which a metal with diffusibility into ceramic, such as Ti or Cr, is sputtered on a surface of a ceramic plate, and Cu is deposited thereon, and subsequently a metal layer is formed thereon by plating or the like, and, as other techniques, inventions described in Patent Literatures 1 to 7 below can be mentioned.

The inventions described in Patent Literatures 1 and 2 are methods in which a copper plate is pressure-bonded to an alumina-ceramic plate and the resultant is heated to approximately the melting point of the copper plate under vacuum to join the copper plate to the alumina-ceramic plate.

The invention described in Patent Literature 3 is a method in which active metal (Ag—Cu—Ti) powder is applied between a ceramic plate and a copper plate or active metal (Ag—Cu—Ti) foil is sandwiched therebetween, and the resultant is pressurized, heated, and joined under vacuum.

The invention described in Patent Literature 4 is a method in which an alumina-ceramic material is immersed in a molten salt bath of NaOH only or NaOH+KOH to excessively roughen a surface of the material, and is subsequently electroless-plated and metal-plated to form a metal layer.

The invention described in Patent Literature 5 is a method (high temperature co-fired ceramic (HTCC)) in which W, Cu—W, or Mo—Mn paste is printed on a ceramic plate, and then the resultant plate is sintered at a high temperature in a reducing atmosphere, and subsequently a metal layer is formed thereon by plating or the like.

The invention described in Patent Literature 6 is a method (low temperature co-fired ceramics (LTCC)) in which Ag, Ag—Pd, or Cu paste is printed and sintered on glass-based ceramic, and subsequently a metal layer is formed thereon by plating or the like.

The invention described in Patent Literature 7 is a method in which a plating layer containing Ti is formed on ceramic, and subsequently the Ti in the plating layer is diffused into ceramic by heat treatment to acquire adhesion.

The above-described conventional techniques for joining a metal film onto a base material such as ceramic have the following problems.

(1) Poor adhesion between ceramic and a metallic film
(2) Large variation in adhesion
(3) High cost of joining
(4) High degree of difficulty in a technique for joining a coating
(5) Expensive equipment required for joining a coating

CITATION LIST

Patent Literature

Patent Literature 1: U.S. Pat. No. 3,766,634
Patent Literature 2: U.S. Pat. No. 3,994,430
Patent Literature 3: Japanese Patent Application Laid-open No. H1-181499
Patent Literature 4: Japanese Patent Application Laid-open No. H3-2833
Patent Literature 5: Japanese Patent Application Laid-open No. S61-58296
Patent Literature 6: Japanese Patent Application Laid-open No. S61-170094
Patent Literature 7: Japanese Patent No. 2778143

SUMMARY

Technical Problem

The present invention has been made in view of the above-mentioned problems, and an object of the present invention is to provide a joined body of a joining base material and a metal layer, the joined body being such that, when the metal layer is joined to the joining base material, the adhesion of the metal layer to the joining base material is high, and variation in the adhesion is small, and the metal layer can be joined to the joining base material at lower cost.

Solution to Problem

The present invention provides a joined body of a joining base material and a metal layer, the joined body being formed by joining the metal layer to a joint surface of the joining base material via an intermediate layer coating. In the intermediate layer coating, an anchor forming material that forms an anchor for joining the metal layer by an anchor effect is dispersed and embedded, and the intermediate layer coating is fused to the joint surface of the joining base material. The embedded anchor forming material partially protrudes outward from the intermediate layer coating while being fused to the intermediate layer coating. The metal layer is joined to a surface of the intermediate layer coating and a surface of the anchor forming material protruding outward from the intermediate layer coating.

In the present invention, for the joining base material, $Al_2O_3$, AlN, $Si_3N_4$, BN, SiC, ZrC, WC, DLC, diamond, silicon wafer, sapphire, ceramic, porcelain, GaC, GaAs, GaN, GaO, LED, graphite, or the like can be preferably used, and besides, any substrate material for electronic components can be used as long as the material at least does not melt during heat treatment for forming the intermediate layer coating of the present invention.

The joining base material may have any of a plate shape, a column shape, a spherical shape, a cylindrical shape, and a bar shape, and the shape of the joining base material is not limited to a particular one.

The intermediate layer coating includes one or two or more kinds of metal components selected from Fe, Ni, Co, Sn, Cu, Ag, Au, Ti, V, Zr, Nb, Ta, W, Mo, Mn, B, Zn, Al, In, Tl, Se, Ir, Pd, Pb, Sb, As, Y, Nd, Te, Ge, Si, alkali metal, and alkaline earth metal, or includes oxide glass produced by melting a compound of the metal components, and the intermediate layer coating is fused to the joining base material.

When the intermediate layer coating is fused to the joining base material and the anchor forming material, the joining base material and the anchor forming material need to be in a solid state, and, naturally, the melting point of the intermediate layer coating is equal to or lower than the melting points of the joining base material and the anchor forming material.

The intermediate layer coating may not be a layer including only oxide, but may be a layer including not only oxide but also ceramic components, such as nitride, carbide, boride, silicide, or sulfide, and a metal component and a metal compound component as long as these components are compatible with oxide, as necessary.

The intermediate layer coating is formed by applying a fusing agent in which the anchor forming material is mixed and dispersed to the joint surface of the joining base material and heating and fusing the resultant.

The fusing agent includes a coating liquid and the anchor forming material dispersed in the coating liquid.

In the coating liquid, a metal component selected from Fe, Ni, Co, Sn, Cu, Ag, Au, Ti, V, Zr, Nb, Ta, W, Mo, Mn, B, Zn, Al, In, Tl, Se, Ir, Pd, Pb, Sb, As, Y, Nd, Te, Ge, Si, alkali metal, and alkaline earth metal, or a compound component of the metal components is mixed or dissolved. Furthermore, for example, a thickener, such as cellulose nitrate, for enhancing the coating performance of the coating liquid is added to the coating liquid, as necessary.

As the anchor forming material that forms an anchor for joining the metal layer by the anchor effect, ceramic or metal particles or fibers selected from oxide powder, carbide powder, nitride powder, boride powder, silicide powder, diatomaceous earth powder, silica gel powder, glass powder, diamond powder, DLC powder, ceramic powder, porcelain powder, silica fiber powder, ceramic fibers, mica powder, graphite powder, kaolin powder, metal powder, metal fibers, and whiskers can be preferably used, and these can be used alone or two or more of them can be used in combination as necessary.

The shape of the anchor forming material according to the present invention is not limited to a particular one. The shape of the anchor forming material before the anchor forming material is embedded, dispersed, and fused in the intermediate layer coating is spherical, angular, polygonal, or fibrous. The shape of the anchor forming material after the anchor forming material is embedded, dispersed, and fused in the intermediate layer coating may be in a form in which the anchor forming materials overlap each other, or in a mesh form in which the anchor forming materials overlap each other.

In particular, the mesh form brings about an effect in such a manner that, when a primary metal layer is formed after the heating and fusing, the primary metal layer fills in mesh gaps, so that adhesion strength dramatically increases.

To lower the fusing temperature of the intermediate layer coating, various kinds of metal salts, various kinds of metal oxides, and salts thereof are beneficially used for a part or the entirety of the coating liquid of the fusing agent.

That is, a metal salt, a metal oxide, and salts thereof are beneficially used for a part or the entirety of a metal component selected from (Fe, Ni, Co, Sn, Cu, Ag, Au, Ti, V, Zr, Nb, Ta, W, Mo, Mn, B, Zn, Al, In, Tl, Se, Ir, Pd, Pb, Sb, As, Y, Nd, Te, Ge, Si, alkali metal, and alkaline earth metal) or a compound component of the metal components.

As the metal salt, the metal oxide, and salts thereof, for example, tin sulfate, copper sulfate, vanadium sulfate, calcium chloride, tungstate, boric acid, borate, silicate, or molybdate may be used.

In the present invention, it is necessary that a fusion layer to serve as the intermediate layer coating is firmly fused to a ceramic base material, and at the same time, the anchor forming material is also firmly joined to the fusion layer. For that purpose, the optimum fusing agent component and the optimum material of the anchor forming material for the formation of the fusion layer need to be selected for every ceramic base material.

In other words, the optimum composition of the fusing agent, and the optimum fusion conditions, such as the thickness of the fusion layer, the kind and shape of the anchor forming material to be fused, a mixed ratio, a fusing temperature, and time, need to be selected.

Regarding the relation between the ceramic base material, the fusing agent, and the anchor forming material to be fused, for example, in the case where the ceramic base material is alumina ceramic, the anchor forming material is preferably alumina particles.

The fusing agent is preferably a mixture of tungstate, vanadium sulfate, boric acid, and the like. The fusion conditions are such that, during heating of the mixture at 1100° C. in the atmosphere, vanadium sulfate is decomposed into $V_2O_3$ and melts at 690° C., boric acid is oxidized to $B_2O_3$ and melts at 577° C., tungstate is oxidized to $W_2O_5$ and the melting point thereof decreases, and these three react with each other, and are fused to an alumina substrate together with alumina particles during heating at 1100° C. In contrast, the melting point of the alumina particles of the anchor forming material is 1600° C., and therefore, the alumina particles are fused without melting and changing in shape at this fusing temperature.

In the case where the ceramic base material is AlN ceramic, the anchor forming materials preferably include BN particles. In the case where the ceramic base material is SiC ceramic, the anchor forming materials preferably include SiC, WC, or ZrC particles, and the adhesion thereof to the base material is high.

In the case where the anchor forming materials include spherical $SiO_2$ particles having an average particle diameter of approximately 1 μm and the amount of the anchor forming materials to be added is 50 g/L, the appearance of the anchor forming materials after the formation of the primary metal layer is in a state illustrated in FIG. 2. In FIG. 2, the anchor forming material is indicated with a white dot, and the primary metal layer is present around the white dot. The anchor forming materials are fused to each other in a state of being spaced. An infinite number of gaps are present between the anchor forming materials. The electroless-plating of metal of the primary metal layer is applied so as to fill in these gaps, and at the same time, a protrusion of the anchor forming material is surrounded and coated.

High adhesion according to the present invention is thought to be generated by an anchor effect produced by this continuous electroless plating layer that fills up gaps between the anchor forming materials and surrounds and coats the protrusions of the anchor forming materials.

In contrast, in the case where the amount of $SiO_2$ particles to be added is small (10 g/L or smaller), the anchor forming materials are interspersed; a flat surface having a smaller amount of deposits of the anchor forming materials overlapping each other and a smaller amount of gaps therebetween is formed, and accordingly, what is called a three-dimensional structure is not achieved. Hence, compared with a case where the addition amount is large (50 g/L or larger), adhesion is slightly lower.

To enhance adhesion strength, the appropriate addition of the anchor forming material is of course important, and furthermore, the shape of the anchor forming material is more important. Rather than the anchor forming material formed of spherical particles, the anchor forming material formed of polygonal particles or being filamentous, mesh, or fibrous form and bonded to each other tend to form a three-dimensional structure and lead to still higher adhesion strength.

The size of the anchor forming material, the thickness of the fusion layer, and the like are determined, depending on a required thickness of the metal layer. For example, when the required thickness of the metal layer is 2 to 5 mm (2000 to 5000 µm), the size of the anchor forming material is preferably 100 to 500 µm and the thickness of the fusion layer is preferably 30 to 200 µm. In contrast, when the required thickness of the metal layer is 20 to 30 µm, the size of the anchor forming material is suitably 0.5 to 5 µm and the thickness of the fusion layer is suitably 0.2 to 2.0 µm.

The thickness of the fusion layer is preferably approximately ⅓ to ½ the thickness of the anchor forming material. It is understood that, when the fusion layer is too thick, the anchor forming material is buried under the fusion layer, whereby the anchor effect decreases.

There are some methods for applying the fusing agent containing the anchor forming material to the ceramic base material. Examples of the method include spraying, dip coating, roll coating, spin coating, showering, and brush coating, and showering is suitable for mass production.

It is most important in the application process that the anchor forming materials are uniformly applied to the entirety of a surface and fused, and the application and the fusing may be repeated two or more times.

In the case where a fine pattern is formed by the metal layer having a several micron width, if adhesion strength is extremely low in some regions, exfoliation from a substrate is caused after the soldering of a semiconductor component, so that reliability remarkably falls and the component cannot be used. Therefore, in the present invention, the application process is the most important process.

As a sintering condition, the atmosphere is satisfactorily the air. Note that heating may be performed in an atmosphere of $N_2$, Ar, or $N_2+H_2$, or in a vacuum, as necessary.

The temperature for sintering is determined, depending on the relation between the anchor forming material and the fusing agent. The anchor forming material is preferably an oxide, carbide, boride, or nitride having a high melting point, and preferably has a high melting point of 1500° C. or higher.

The melting point of the fusion layer to serve as the intermediate layer coating can be changed, depending on a composition and a blending ratio.

Among fusion conditions, temperature and time are programmed beforehand.

For example, steps are beneficially set in a program in advance and executed in such a manner that fusing is performed for 2 hours until the temperature reaches 300° C., fusing is performed for 1 hour until the temperature reaches 300° C. to 600° C., fusing is performed for 1 hour until the temperature reaches 600° C. to 1000° C., fusing is performed for 2 hours until the temperature reaches 1000° C. to 1200° C., and subsequently slow cooling is performed.

When primary and secondary metal layers are formed as metal layers, spots or projections-and-recesses may be generated in a surface by the influence of the anchor forming material. In this case, smoothing and re-plating may be performed after polishing.

It is important that the melting point of the anchor forming material is considerably higher than the melting point of the fusing agent. If the difference between the melting point of the anchor forming material and the melting point of the fusing agent is small, there is a risk of changing in the shape of the anchor forming material or the risk of melting of the anchor forming material. In that case, adhesion strength decreases. Preferable composition and blending ratio of the anchor forming material and the fusing agent are as described in the following Examples, for example.

The kind and blending ratio of the fusing agent are basically set in such a manner that the fusing agent is changed by heating into an oxide and melts to be a glassy state, and is fused to the ceramic base material. In addition, it is necessary to mix several kinds of fusing agents to achieve a composition that brings about a lower fusing temperature.

The metal layer preferably has a structure in which a primary metal layer is formed on a surface of the joining base material by the use of a wet process or a dry process, and furthermore, a secondary metal layer is formed on the primary metal layer by the use of a method different from that used for the primary metal layer. A thick metal layer can be formed of only the primary metal layer, but, in that case, there are problems that, for example, many hours are required for deposition and the resultant coating has poor physical characteristics. Therefore, a structure in which the secondary metal layer is formed on the primary metal layer by a method different from that used for the primary metal layer is preferable.

An electroplating method is most suitable for the formation of the secondary metal layer. The most preferable electroplating method is a copper sulfate electroplating method, which makes it possible to obtain a thick metal layer in a short time. Furthermore, the method has advantages that the resultant metal layer is excellent in physical characteristics (plasticity, conductivity) and a circuit and a pad can be easily formed by etching or the like. Furthermore, the method has an advantage that adhesion is enhanced by heat treatment at 350° C. to 550° C. for 30 to 90 minutes after plating.

The reason why the primary metal layer is necessary is that, as described above, the primary metal layer is important in securing the adhesion by perfectly applying plating to gaps between the anchor forming materials and coating the surroundings of the anchor forming materials with the plating metal, and furthermore, important in giving electric conductivity to the subsequent electroplating layer (the secondary metal layer).

For the formation of the primary metal layer, a wet process or a dry process can be used, but, a wet process is advantageous in terms of costs and mass production.

The wet process for the primary metal layer is a process in which sensitizer-activator treatment is performed by a well-known method to deposit an electroless plating coating, and the wet process is preferably electroless copper plating, electroless nickel plating, or electroless cobalt plating.

As the dry process, vacuum deposition, sputtering, ion plating, or CVD can be applied. Preferable examples of the dry process include a method in which, first, Cr is deposited to a thickness of 0.1 to 1.0 µm, and subsequently Cu is deposited thereon to a thickness of 0.1 to 1.0 µm and a method in which Ti is deposited to a thickness of 0.1 to 1.0 µm, and subsequently Cu is deposited thereon to a thickness of 0.1 to 1.0 µm.

For the coating metal of the primary metal layer, any one or two or more kinds of metals from Cu, Ni, Co, Cr, Ti, Fe, Mo, Mn, As, Au, Pd, Pt, Sn, Zn, Ni—P, Ni—B, Ni—B—W, Ni—P—W, Ni—P—W—B, Ni—Co, Ni—Co—Fe, Ni—Co—P, Co—P, Co—B, Ni—B—Mo, Co—P—W, Co—P—Mo, and Fe—Ni, or an alloy thereof is suitable.

The thickness of the primary metal layer is preferably 0.001 to 10 µm.

For electroless nickel and cobalt coatings, electroless plating metals, such as Ni—P, Ni—B, Ni—B—W, Ni—P—W, Ni—P—W—B, Ni—Co, Ni—Co—Fe, Ni—Co—P, Co—P, Co—B, Ni—B—Mo, Co—P—W, and Co—P—Mo, can be preferably used.

The present invention is mainly made use of for heat sinks for power transistors and LED. For that purpose, it is necessary to form a circuit and a pad.

In this case, a ceramic substrate is used as the joining base material, and photolithography is applied to a metal layer, in other words, both masking and etching of the metal layer are performed, whereby a circuit and a pad can be formed on the ceramic substrate.

As typical methods for forming a circuit and a pad by photolithography, the following three methods can be mentioned.

A method in which a metal layer is formed on the whole surface of a ceramic substrate, and subsequently a circuit and a pad are formed using photolithography.

A method in which an opening is provided in portions for a circuit and a pad of a ceramic substrate, and a fusing agent containing an anchor forming material is applied to the opening, and a metal layer is formed only in the opening.

A method, called SAP, in which a metal layer having a thickness of 2 to 3 μm is formed on the whole surface; a dry film or the like is stuck on the metal layer; an opening is formed in a circuit and a pad by photolithography; the opening is thickly plated; after the removal of photoresist, a portion of a metal layer other than the opening is removed by etching or the like to produce a circuit and a pad.

When the above-described three typical methods for forming a circuit and a pad are applied to the present invention, specifically the following three methods are used.

First Method

A method (called SAP) in which, after the formation of a primary metal layer on the ceramic substrate, a mask is formed by photolithography; a secondary metal layer is provided in portions of the primary metal layer, the portions corresponding to a circuit and a pad, and subsequently the mask is removed, and then, the primary metal layer remaining under the mask is removed to form the circuit and the pad.

Second Method

A method in which a mask is provided in a portion of the ceramic substrate, other than a circuit and a pad, and primary and secondary metal layers are formed only in portions corresponding to the circuit and the pad, respectively, whereby the circuit and the pad are formed.

Third Method

A method in which, after the formation of a primary metal layer and a secondary metal layer on the ceramic substrate, a mask is formed, and, while portions of the metal layers, the portions respectively corresponding to a circuit and a pad, are left as they are, other portions are removed to form the circuit and the pad.

The surfaces of the secondary metal layer in the circuit and the pad are preferably plated with Ni, Sn, Pd, Ag, Au, Pt, Pb, Ni—Pd—Au, Ni—Sn, Ni—Sn—Ag—Cu, Sn—Bi, or Sn—Cu, which are excellent in soldering as a downstream process and are excellent in wire bonding performance.

An electronic component can be joined to and mounted on the metal layer of the present invention, as necessary.

Advantageous Effects of Invention

The present invention provides a structure in which an intermediate layer coating is formed on a joint surface of a joining base material and the joining base material is joined to a metal layer via the intermediate layer coating. The structure of the intermediate layer coating is a structure in which an anchor forming material that forms an anchor for joining the metal layer by an anchor effect is embedded in the intermediate layer coating, and the anchor forming materials are dispersed while being firmly joined to a fusion layer. The intermediate layer coating is fused to the joint surface of the joining base material, and an end of the anchor forming material protrudes outward from the intermediate layer coating, whereby, at the time of joining to the metal layer, a metal film is joined to both a surface of the intermediate layer coating and a protrusion of the anchor forming material. Thus, the metal layer joined by the anchor effect exhibits extremely high adhesion to the joining base material, and furthermore, variation in the adhesion is small. Furthermore, expensive equipment for joining is not needed, so that joining can be performed at low costs.

DESCRIPTION OF EMBODIMENTS

Hereinafter, embodiments of the present invention will be described by putting the embodiments in contrast with conventional methods. Note that the present embodiments will be specifically described for the purpose of making the spirit of the present invention easier to understand, and of course, the present invention is not limited to the embodiments.

EXAMPLE 1

A 99% alumina ceramic plate was used as a joining base material.

Figure 1:
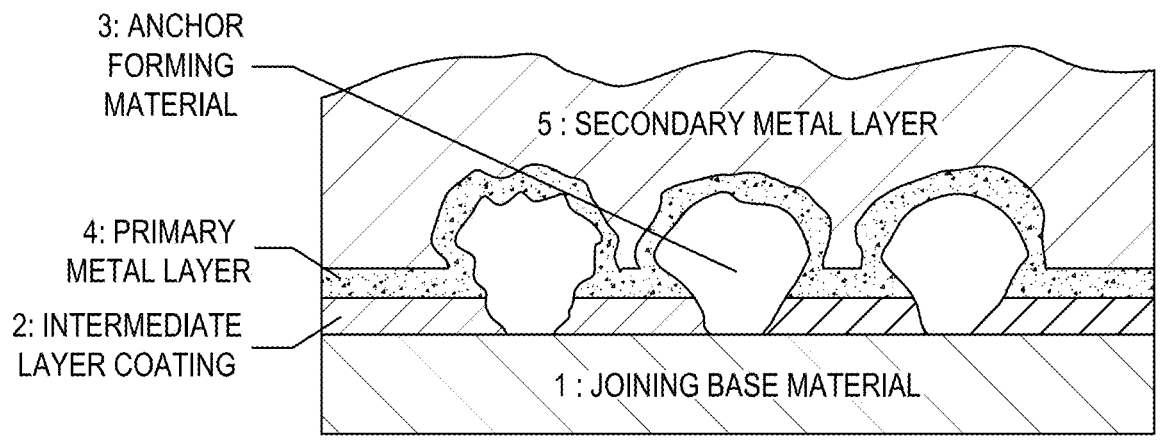
FIG. 1 is a schematic diagram for explaining relations among a joining base material, an intermediate layer coating, anchor forming materials, and metal layers (a primary metal layer and a secondary metal layer).
Figure 2:
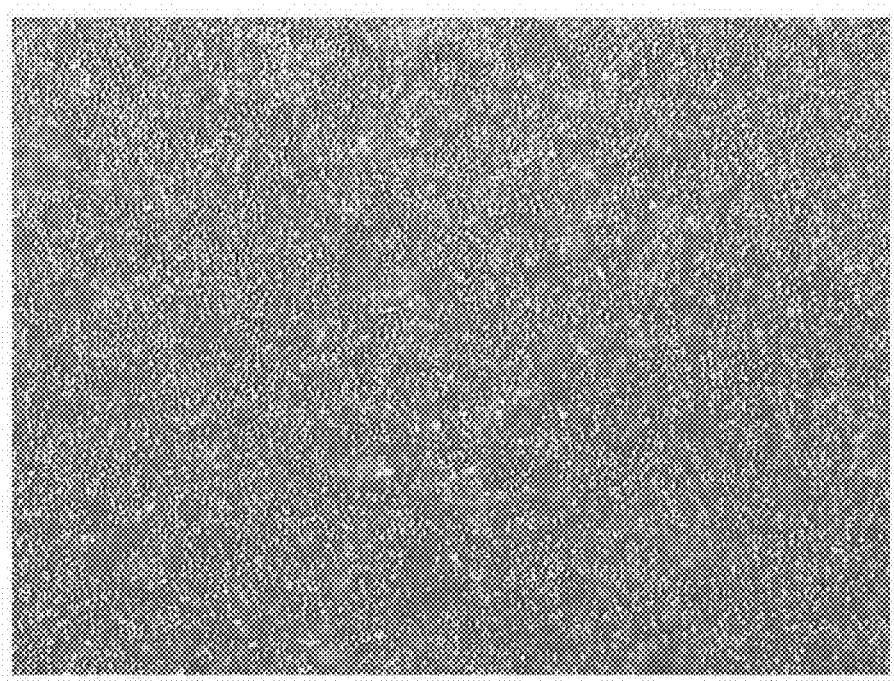
FIG. 2 is a picture of anchor forming materials firmly adhering to a ceramic (after the formation of a primary metal layer).

(1) In accordance with a conventional method, the alumina ceramic plate was degreased, pickled, and etched, and then dried.
(2) Water was added to 50 g of a $SiO_2$ anchor forming material having an average particle diameter of 0.5 to 1.0 μm, 20 g of sodium tungstate, 30 g of vanadium sulfate, and 20 g of boric acid to produce 1 L of a solution, and the solution was stirred for 5 hours to prepare a fusing agent containing the anchor forming material for forming a fusion layer to be serve as an intermediate layer coating.
(3) This fusing agent was applied to the alumina ceramic plate prepared at (1) by spraying.
(4) The plate was air-dried for 5 hours.
(5) Using an electric furnace, the plate was heated at 1000° C. for 2 hours.
(6) $SiO_2$ particles were fused to the alumina plate (see FIG. 2).
(7) To obtain a primary metal layer, in accordance with a conventional method, the plate was subjected to sensitizer-activator treatment and coated with 2 μm of electroless copper plating.

(8) To obtain a secondary metal layer, in accordance with a conventional method, the plate was electroplated with copper sulfate to attain 30-μm-thick copper layer.
(9) The plate was subjected to heat treatment at 500° C. for 30 minutes in an atmosphere of $N_2$.
(10) A dry film was stuck on the plate, and a circuit and a pad were formed thereon by photolithography.
(11) Subsequently, electroless Ni—Pd—Au plating was applied only to a portion on which a semiconductor element was mounted.
(12) A heat sink for power semiconductors was produced.
(13) Adhesion strength between the alumina ceramic plate and the copper plating was measured at three points.

The peel strength was 2.5 to 2.3 kg/cm. Note that, when the peel strength was 1.0 kg/cm or more, the plate can be used as a substrate for power semiconductors.

For comparison, the peel strength of a plate produced not through the step of forming a fusion layer of the present invention, but through other steps identical to the steps according to the present invention was also measured at three points, and as a result, the peel strength was 0.1 to 0.05 kg/cm, which meant that the copper plating did not adhere the alumina ceramic plate at all.

It was confirmed that, in the present example, adhesion was remarkably enhanced.

EXAMPLE 2

A silicon nitride substrate was used as a joining base material.
(1) In accordance with a conventional method, the silicon nitride substrate was degreased, pickled, and etched, and then dried. Subsequently, a surface of the substrate was roughened by honing to achieve approximately Ra 0.2 μm.
(2) Water was added to 50 g of a SiC anchor forming material having an average particle diameter of 0.5 to 1.5 μm, 10 g of $CaCl_2$, 50 g of $SnSO_4$, 50 g of $TiSO_4$, and 50 g of sodium silicate to produce 1 L of a solution, and the solution was stirred for 5 hours to prepare a fusing agent for forming a fusion layer.
(3) Using a spin coater, this fusing agent was applied to the silicon nitride substrate prepared at (1).
(4) The substrate was air-dried for 5 hours, and then heated at 800° C. for 2 hours and at 1100° C. for 2 hours.
(5) SiC particles were fused to the silicon nitride substrate.
(6) To obtain a primary metal layer, in accordance with a conventional method, the substrate was subjected to sensitizer-activator treatment to be electroless-plated with 1 μm of Ni—B.
(7) Subsequently, to obtain a secondary metal layer, in accordance with a conventional method, the substrate was electroplated with 50 μm of copper by using copper sulfate.
(8) Adhesion strength was measured at three points in the same manner as in Example 1, and as a result, the peel strength was 2.5 to 2.4 kg/cm.
(9) In this substrate, using photolithography, a circuit and a pad were formed, and then the substrate was plated with 0.2 μm of Pd, and furthermore plated with 0.01 μm of Au, and then a SiC-based power transistor was mounted thereon.

For comparison, the peel strength of a substrate produced not through the step of forming the fusion layer of the present example, but through other steps identical to the steps according to the present example was measured at three points, and as a result, the peel strength was 0.1 to 0.01 kg/cm, which meant that the metal layers did not adhere the substrate at all.

It was confirmed that, in the present example, the adhesion was remarkably enhanced.

EXAMPLE 3

An AlN substrate was used as a joining base material.
(1) In accordance with a conventional method, the AlN substrate (trade name: SHAPAL, manufactured by Tokuyama Corporation) was degreased, pickled, and etched, and then dried.
(2) Water was added to, as an anchor forming material, 50 g of BN particles having a particle diameter of 0.5 to 1.5 μm, 50 g of sodium molybdate, 10 g of titanium sulfate, and 50 g of kaolin to produce 1 L of a solution, and the solution was stirred for 5 hours to prepare a fusing agent for forming a fusion layer.
(3) A dry film was stuck on the AlN substrate prepared at (1), and by photolithography, openings were produced in portions for a circuit and a pad.
(4) The fusing agent prepared at (2) was sprayed so that the fusing agent remains only in the openings and the substrate was air-dried.
(5) Using an electric furnace, the substrate was heated at 200° C. for 1 hour to remove the fusing agent remaining on the dry film, and then heated at 1100° C. for 3 hours. The BN particles were fused only to the openings.
(6) To obtain a primary metal layer, the substrate was subjected to sensitizer-activator treatment, and electroless-plated with 3 μm of copper. At this point, copper plating was deposited on the whole surface of the substrate.
(7) To leave the copper plating only in the openings, once a tape was stuck on the whole surface, and then the tape was removed therefrom, and as a result, the copper plating did not adhere tightly on portions to which the anchor forming material did not firmly adhere, other than the openings, the copper plating was peeled off and the plating remained only in the openings.
(8) To obtain a secondary metal layer, the substrate was electroless-plated with 20 μm of copper.
(9) The substrate was subjected to heat treatment at 450° C. for 30 minutes in the atmosphere.
(10) The adhesion strength was measured at three points, and as a result, the peel strength was 2.6 to 2.5 kg/cm.

For comparison, the peel strength of a portion, without any anchor forming material, of the AlN substrate was measured at three points, and as a result, the peel strength was 0.1 to 0.05 kg/cm.

EXAMPLE 4

Sapphire (99.99% $Al_2O_3$) was used as a joining base material.
(1) In accordance with a conventional method, a sapphire substrate was degreased and etched, and then dried.
(2) Water was added to, as an anchor forming material, 30 g of a Pyrex glass powder having a particle diameter of 0.3 to 1.5 μm, 50 g of ferrous ammonium sulfate, 20 g of $MoO_3$, 20 g of $H_3BO_3$, 1 g of $AgNO_3$, and 5 g of a silane coupling agent A-1100 to produce 1 L of a solution, and the solution was stirred for 5 hours to prepare a fusing agent containing the anchor forming material for forming a fusion layer.

(3) The fusing agent prepared at (2) was applied to the sapphire substrate prepared at (1) by spraying.

(4) The substrate was air-dried, and then heated at 700° C. for 2 hours and at 1100° C. for 2 hours.

Glass particles were fused to the sapphire substrate.

(5) To obtain a primary metal layer, 0.5 µm of Ti and 2 µm of Cu were deposited on the whole surface of the sapphire substrate by ion plating to coat the whole surface.

(6) Subsequently, to obtain a secondary metal layer, the substrate was plated with 30 µm of copper sulfate. The adhesion strength was measured at three points, and as a result, the peel strength was 1.8 to 1.7 kg/cm.

For comparison, the peel strength of a substrate produced not through the step of fusing the anchor forming material according to the present example, but through other steps identical to the steps according to the present example was measured at three points, and as a result, the peel strength was 0.3 to 0.1 kg/cm, and hence the comparative substrate was not able to be used for a substrate for mounting electronic components thereon.

EXAMPLE 5

A commercially available SiC plate was used as a joining base material.

(1) In accordance with a conventional method, the SiC plate was degreased and etched, and then dried.

(2) Water was added to, as an anchor forming material, 30 g of commercially available SiC particles having a particle diameter of 0.3 to 1.5 µm, 50 g of glaze (SK-12, glaze for pottery), 20 g of $AgNO_3$, 10 g of EDTA-Cu, 5 g of titanium sulfate, and 20 g of $B_2O_3$ to produce 1 L of a solution, and the solution was stirred for 5 hours to prepare a fusing agent containing the anchor forming material.

(3) This fusing agent was uniformly applied to the SiC plate prepared at (1) by spraying, and then the substrate was air-dried for 10 hours.

(4) Using an electric furnace, the substrate was heated at 1300° C. for 3 hours.

(5) SiC particles were uniformly fused to the SIC plate.

(6) To obtain a primary metal layer, in accordance with a conventional method, the plate was subjected to sensitizer-activator treatment, and the whole surface of the plate was electroless-plated with 1.0 to 1.5 µm of Ni—B.

(7) A dry film was stuck on the plate and the plate was subjected to treatment by photolithography so that openings were formed only in a circuit and a pad, and then the pad and the circuit were coated with 30 µm plating by using a copper sulfate plating bath to form a secondary metal layer.

(8) After the dry film was peeled off, portions other than portions for the circuit and the pad were removed by quick etching.

This is a circuit formation method according to what is called SAP (Semi Additive Process).

The adhesion strength of the circuit was measured at three points, and as a result, the peel strength was 1.9 to 1.8 kg/cm.

For comparison, the adhesion strength of a plate produced not through the step of firmly adhering the anchor forming material according to the present example, but through other steps identical to the steps according to the present example was measured at three points, and as a result, the peel strength was 0.3 to 0.1 kg/cm, which meant that the substrate with such strength was not able to be put to practical use.

EXAMPLE 6

A commercially available WC plate was used as a joining base material.

(1) In accordance with a conventional method, the WC plate was degreased and etched, and then dried.

(2) Water was added to, as an anchor forming material, 30 g of SiC particles having a particle diameter of 0.5 to 1.5 µm, 10 g of a silane coupling agent A-1100, 50 g of vanadium sulfate, 50 g of commercially available glaze (SK-9), and 10 g of water glass to produce 1 L of a solution, and the solution was stirred for 5 hours to prepare a fusing agent containing the anchor forming material.

(3) This fusing agent was uniformly applied to the WC plate prepared at (1) by a spin coater. Subsequently, the plate was air-dried for 10 hours.

(4) Using an electric furnace, the plate was heated at 1200° C. for 3 hours.

(5) SiC particles were uniformly fused to the WC plate.

(6) To form a primary metal layer, the plate was coated with 1.0 µm of copper by sputtering. Subsequently, the plate was electroplated with 50 µm of copper (a secondary metal layer).

(7) The plate was subjected to heat treatment at 400° C. for 30 minutes in an atmosphere of $N_2+H_2$.

(8) The adhesion strength was measured at three points, and as a result, the peel strength was 2.9 to 2.4 kg/cm.

For comparison, the adhesion strength of a plate produced without the treatment according to the present example was measured at three points, and as a result, the peel strength was approximately 0.1 to 0.03 kg/cm, and accordingly the peeling-off was easily made in a tape-peeling test.

EXAMPLE 7

A commercially available AlN substrate (SHAPAL) was used as a joining base material.

(1) In accordance with a conventional method, the AlN substrate was degreased and etched, and then dried.

(2) Water was added to, as an anchor forming material, 60 g of Ni fine particles having an average particle diameter of 1.5 µm, 50 g of $MoO_3$, 10 g of $B_2O_3$, and 50 g of a silane coupling agent (A-1100) to produce 1 L of a solution.

The solution was stirred for 5 hours to prepare a fusing agent containing the anchor forming material for forming a fusion layer.

(3) A dry film was stuck on the whole surface of the AlN substrate, and the substrate was subjected to treatment by photolithography so that openings were respectively formed only in portions for a circuit and a pad.

(4) The fusing agent prepared at (2) was applied only to the openings.

(5) After air-dried, the substrate was heated using an electric furnace at 1100° C. for 2 hours.

(6) After the substrate was subjected to sensitizer-activator treatment, the whole surface of the substrate was electroless-plated with 3 µm of copper.

(7) The substrate was subjected to treatment by photolithography in the same manner as that at the step (3) so that the circuit and the pad became openings.

(8) Only the pad and the circuit were electroplated with 20 μm of copper and furthermore electroplated with Ni—Pd—Au thereon. Subsequently, after photoresist was removed, thin copper plating film present in a portion other than the circuit and the pad was peeled off (SAP) to prepare a plating substrate in which only the pad and the circuit remain, and a power transistor was mounted on the pad.

(9) The adhesion strength was measured, and as a result, the peel strength was 2.7 to 2.5 kg/cm.

For comparison, the adhesion strength of a substrate in the absence of the anchor forming material was measured, and as a result, the peel strength was 0.1 to 0.01 kg/cm.

EXAMPLE 8

A commercially available SiC substrate was used as a joining base material.
(1) In accordance with a conventional method, the SiC substrate was degreased and etched, and then dried.
(2) Water was added to, as an anchor forming material, 60 g of SiC fibers having a diameter of 1.0 μm and a length of 4 to 5 μm, 50 g of water glass, 50 g of ammonium molybdate, 50 g of vanadium oxide, and 5 g of boric acid to produce 1 L of a solution, and the solution was stirred for 3 hours to prepare a fusing agent for forming a fusion layer.
(3) This fusing agent was applied to the SiC substrate prepared at (1) by showering.
(4) After air-dried, the substrate was heated at 1100° C. for 3 hours. The SiC fibers were deposited in a mesh form and adhered to each other.
(5) Using a well-known method, the substrate was electroless-plated with 3 μm of copper and then plated with 30 μm of copper sulfate. The adhesion strength was measured at three points, and as a result, the peel strength was 2.8 to 2.6 kg/cm.

In contrast, the adhesion strength of a substrate to which the fusing agent according to the present invention was not applied was measured at three points, and as a result, the peel strength was 0.1 to 0.01 kg/cm.

In Examples 1 to 8 described above, it was confirmed that the adhesion strength according to the present invention was several times to several tens of times higher than the adhesion strength in the case where the fusion layer serving as the intermediate layer coating according to the present invention was not formed (that is, in the case of conventional plating), and furthermore, variation in the adhesion strength was much smaller.

EXAMPLE 9

Using an $Al_2O_3$ substrate having a size of 100 mm×80 mm×thickness 0.3 mm, comparisons of adhesion strength and variation thereof with a conventional method were made.

As the conventional method, there was employed a method in which the substrate was immersed in a strong-alkaline molten salt and a surface of the substrate was etched and plated.

A test was performed in such a manner that a pad having a size of 2 mm×2 mm was formed on a surface of the $Al_2O$ substrate, and a wire was soldered thereto, and the adhesion strength (pull strength) was measured by vertical pulling.

0.5 μm of electroless Cu plating was applied to form a primary metal layer, and 40 μm of Cu electroplating was applied to form a secondary metal layer. To enhance solderability, 0.1 μm of electroless Au plating was applied onto the Cu.

The number of measurement points was 10 points.
Table 1 lists tensile test results.

TABLE 1

| | 1 | 2 | 3 | 4 | 5 | 6 | 7 | 8 | 9 | 10 |
|---|---|---|---|---|---|---|---|---|---|---|
| Present Example | 4.3 | 4.8 | 4.0 | 3.7 | 4.4 | 4.2 | 4.0 | 3.9 | 4.4 | 4.2 |
| Comparative Example | 3.8 | 5.2 | 1.0 | 4.1 | 3.0 | 3.6 | 2.2 | 3.1 | 0.8 | 4.2 |

The results listed in Table 1 reveal that the present example (using the same method as that in Example 3) exhibits higher tensile strength and extremely smaller variation in tensile strength. In contrast, the results reveal that, in a comparative example using the conventional method, the tensile strength is considerably high, but, variation in the tensile strength is large. It was confirmed that, compared with than the conventional technique, the present invention exhibited higher tensile strength and extremely smaller variation in the tensile strength.

Tables 2 to 21 respectively illustrate Examples 10 to 29 in which different combinations of the ceramic base material, the anchor forming material, and the fusing component are employed.

In the tables, Comparative Example indicates peel strength according to the conventional technique in the case of not applying the fusing agent.

In the tables, peel strength indicates the results of three-point measurements of the present invention and the comparative example, as in the case of Examples 1 to 8.

In Examples 10 to 29, pretreatment of a joining base material and application of a fusing agent were performed in the same manner as in Examples 1 to 8. Furthermore, after secondary plating, in the present examples and comparative examples, peel strength was measured after 30-minute heat treatment at 400° C. in an atmosphere of $N_2$.

EXAMPLE 10

Table 2 lists results.

EXAMPLE 11

Table 3 lists results.

EXAMPLE 12

Table 4 lists results.

EXAMPLE 13

Table 5 lists results.

EXAMPLE 14

Table 6 lists results.

EXAMPLE 15

Table 7 lists results.

EXAMPLE 16

Table 8 lists results.

EXAMPLE 17

Table 9 lists results.

EXAMPLE 18

Table 10 lists results.

EXAMPLE 19

Table 11 lists results.

EXAMPLE 20

Table 12 lists results.

EXAMPLE 21

Table 13 lists results.

EXAMPLE 22

Table 14 lists results.

EXAMPLE 23

Table 15 lists results.

EXAMPLE 24

Table 15 lists results.

EXAMPLE 25

Table 17 lists results.

EXAMPLE 26

Table 18 lists results.

EXAMPLE 27

Table 18 lists results.

EXAMPLE 28

Table 19 lists results.

EXAMPLE 29

Table 20 lists results.

TABLE 2

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| WC | SiO$_2$ 0.5-1.5 μm 50 g/L | Sodium Silicate: 20 Ammonium Molybdate: 50 Boric Acid: 50 Copper Sulfate: 20 Water: Remainder | 1200° C. × 3 hours | Primary: Ni—B 1.0 μm Secondary: Cu 30 μm | 2.7-2.4 Comparative Example: 0.5-0.1 |

TABLE 3

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| DLC | BN 0.5-1.5 μm 30 g/L | Antimony Sulfate: 30 Manganese Sulfate: 20 Indium Sulfate: 30 Silver Chloride: 30 Water: Remainder | 1000° C. × 2 hours | Primary: Cu 1.0 μm Secondary: Cu 40 μm | 2.0-2.0 Comparative Example: 1.0-0.01 |

TABLE 4

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| Porcelain | TiO$_2$ 0.5-2.0 μm 50 g/L | Glaze (SK-12): 50 AgNO$_3$: 50 Zirconium Sulfate: 50 Water: Remainder | 1000° C. × 3 hours | Primary: Cu 2.0 μm Secondary: Cu 20 μm | 2.5-2.2 Comparative Example: 1.0-0.01 |

TABLE 5

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| AlN (SHAPAL) | Pyrex Glass Powder Particle Diameter: 0.1-3.0 μm 10 g/L | Molybdenum Oxide: 20 Boric Acid: 10 Vanadium Sulfate: 10 Silane Coupling Agent (A-1100): 5 Water: Remainder | 1100° C. × 4 hours | Primary: Ni—P 2.0 μm Secondary: Cu 40 μm | 2.7-2.4 Comparative Example: 0.6-0.2 |

TABLE 6

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| $Si_3N_4$ | BN Particle Diameter: 0.5-1.5 μm 60 g/L | Silver Nitrate: 10 Thallium Sulfate: 50 Sodium Silicate: 20 Borax: 20 Water: Remainder | 1300° C. × 3 hours | Primary: Cu 2.0 μm Secondary: Cu 30 μm | 2.6-2.3 Comparative Example: 0.1-0.01 |

TABLE 7

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| SiC | $SiO_2$ Particle Diameter: 0.5-1.5 μm 50 g/L | Copper Sulfate: 50 Titanium Sulfate: 50 Silver Nitrate: 30 Water: Remainder | 1400° C. × 3 hours | Primary: Ni—B 1.0 μm Secondary: Cu 30 μm | 2.4-2.0 Comparative Example: 0.1-0.01 |

TABLE 8

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| BN | BN Particle Diameter: 0.5-1.5 μm 30 g/L | Sodium Molybdate: 10 Boron Oxide: 10 Sodium Silicate: 10 Water: Remainder | 1000° C. × 4 hours | Primary: Cu 2.0 μm Secondary: Cu 40 μm | 2.9-2.7 Comparative Example: 0.5-0.1 |

TABLE 9

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| Ceramic | TiB$_2$ Particle Diameter: 0.5-1.5 μm 15 g/L | Kaolin: 100<br>Manganese Sulfate: 50<br>Yttrium Sulfate: 5<br>Zinc Sulfate: 50<br>Water: Remainder | 1000° C. × 3 hours | Primary: Ni—B 2.0 μm<br>Secondary: Cu 40 μm | 2.6-2.3 Comparative Example: 1.0-0.01 |

TABLE 10

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| AlN (SHAPAL) | ZrC Particle Diameter: 0.5-2.5 μm 30 g/L | Boric Acid: 30<br>Manganese Sulfate: 30<br>Yttrium Nitrate: 30<br>Water: Remainder | 1200° C. × 3 hours | Primary: Ni—Co—B 2.0 μm<br>Secondary: Cu 10 μm | 2.4-2.1 Comparative Example: 0.4-0.1 |

TABLE 11

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| GaAs | SiO$_2$ Particle Diameter: 0.5-1.5 μm 40 g/L | Molybdenum Oxide: 10<br>Boron Oxide: 50<br>Vanadium Sulfate: 50<br>Water: Remainder | 1000° C. × 4 hours | Primary: Ni—B—W 2.0 μm<br>Secondary: Cu 40 μm | 2.9-2.7 Comparative Example: 0.1-0.01 |

TABLE 12

| Joining Base Material | Anchor Forming Material | Components of Fusing Agent and Concentration (g/L·) of Each Component | Sintering Condition Temperature × Time | Primary Metal Layer and Secondary Metal Layer | Adhesion Strength kg/cm |
|---|---|---|---|---|---|
| GaN | CeO$_2$ Particle Diameter: 0.5-1.5 μm 30 g/L | Ammonium Tungstate: 10<br>Tantalum Sulfate: 10<br>Yttrium Nitrate: 50<br>Silver Nitrate: 3<br>Water: Remainder | 1200° C. × 3 hours | Primary: Co—B 1.0 μm<br>Secondary: Cu 40 μm | 2.4-2.2 Comparative Example: 0.3-0.1 |

TABLE 13

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| GaO | SiC Particle Diameter: 0.5-1.0 μm 50 g/L | Sodium Silicate: 20<br>Tin Sulfate: 10<br>Calcium Hydroxide: 20<br>Titanium Sulfate: 50<br>Water: Remainder | 1000° C. × 4 hours | Primary: Co—P 1.0 μm<br>Secondary: Cu 40 μm | 2.0-2.0 Comparative Example: 0.1-0.05 |

TABLE 14

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| Si Wafer | Silica Gel Particle Diameter: 0.5-1.0 μm 20 g/L | Sodium Silicate: 10 Zinc Sulfate: 10 Titanium Sulfate: 5 Bismuth Citrate: 10 Water: Remainder | 900° C. × 2 hours | Primary: Ni—B 2.0 μm Secondary: Ni 5 μm | 2.0-2.0 Comparative Example: 0.1-0.01 |

TABLE 15

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| SiC | SiC Particle Diameter: 0.5-1.6 μm 10 g/L $Al_2O_3$ 1.0-5.0 μm 50 g/L | Boric Acid: 100 Glaze (SK-12): 20 Titanium Nitrate: 50 Bismuth Citrate: 10 Silver Nitrate: 20 Water: Remainder | 1400° C. × 3 hours | Primary: Cu 2.0 μm Secondary: Cu 40 μm | 2.6-2.4 Comparative Example: 0.6-0.1 |

TABLE 16

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| AlN | BN: 1.0-5.0 μm 15 g/L WC: 1.0-5.0 μm 10 g/L $SiO_2$ Fibers: 10 g/L | Sodium Silicate: 20 Kaolin: 10 Silane Coupling Agent A-1100: 5 Titanium Chloride: 2 Copper Nitrate: 20 Silver Nitrate: 20 Water: Remainder | 1200° C. × 3 hours | Primary: Ni—P 1.0 μm Secondary: Cu 30 μm | 2.1-2.0 Comparative Example: 0.1-0.01 |

TABLE 17

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| GaN | $B_4C$: 1.0-5.0 μm 10 g/L $Si_3N_4$: 0.5-5.0 μm 10 g/L WSiC: 1.0-5.0 μm 10 g/L | Yttrium Oxide: 50 $GeSO_4$: 10 $B_2O_3$: 50 $V_2O_5$: 50 Sodium Silicate: 10 Water: Remainder | 1000° C. × 2 hours | Primary: Cu 2.0 μm Secondary: Cu—Ni—Au 30 μm | 2.4-2.2 Comparative Example: 0.2-0.05 |

TABLE 18

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| $Al_2O_3$ | $SiO_2$: 1.0-5.0 μm 10 g/L $Al_2O_3$: 1.0-5.0 μm 20 g/L | Ammonium Tungstate: 100 Vanadium Sulfate: 20 Boric Acid: 50 Water: Remainder | 1200° C. × 3 hours | Primary: Sputtering Ti/Cu 1 μm Secondary: Cu 30 μm | 2.0-2.0 Comparative Example: 0.1-0.01 |

TABLE 19

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| AlN | SiC: 1.0-5.0 μm 10 g/L BN: 0.5-5.0 μm 10 g/L | Ammonium Molybdate: 50 Boric Acid: 10 Silver Nitrate: 20 Water: Remainder | 1000° C. × 4 hours | Primary: Sputtering Cr/Cu 1 μm Secondary: Cu 30 μm | 2.0-2.0 Comparative Example: 0.3-0.05 |

TABLE 20

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| Pyrex Glass | $SiO_2$: 1.0-5.0 μm 30 g/L | Copper Sulfate: 20 Titanium Sulfate: 30 Silver Nitrate: 30 Water Glass: 20 Water: Remainder | 1000° C. × 3 hours | Primary: CVD Ti/Cr/Cu 1 μm Secondary: Cu 30 μm | 2.1-2.0 Comparative Example: 0.1-0.01 |

TABLE 21

| Joining Base Material | Anchor Forming Material | Components of Fusing Agent and Concentration (g/L) of Each Component | Sintering Condition Temperature × Time | Primary Metal Layer and Secondary Metal Layer | Adhesion Strength kg/cm |
|---|---|---|---|---|---|
| Sapphire | TiB: 1.0-5.0 μm 10 g/L Artificial Diamond: 1.0-5.0 μm 50 g/L | Germanium Sulfate: 20 Sodium Silicate: 50 $Al(OH)_3$: 10 Manganese Sulfate: 10 Silane Coupling Agent (A-1100): 5 Water: Remainder | 1000° C. × 3 hours | Primary: Cu 2.0 μm Secondary: Cu 40 μm | 2.6-2.5 Comparative Example: 0.3-0.05 |

As described above, Examples 10 to 29 listed in Tables 2 to 21 exhibited an adhesion strength of 2.9 to 2.0 kg/cm.

In contrast, the peel strength in the case of not applying the fusing agent (Comparative Examples) was 1.0 to 0.01 kg/cm.

Compared with Comparative Examples, the present examples exhibited remarkably higher strength, and furthermore exhibited a very small variation in the data.

A substrate for power semiconductors needs a peel strength of 1.0 kg/cm or higher. In Comparative Examples, a portion having the maximum strength of 1 kg was present in a test piece, meanwhile other portions in the same test piece had a low strength and thus, all of the other portions did not satisfy the condition.

It was revealed that, according to the present invention, the strength was twice or higher the required minimum strength, and not only the strength was high, but also variation in the strength was small, and furthermore, even when components of a fusing agent were changed, the strength was stably achieved, and thus, it was found that joining with higher reliability was achieved.

INDUSTRIAL APPLICABILITY

The present invention is mainly used for heat sinks for power transistors and LED, components of electric vehicles, fuel cells, and the likes, and the achievement of substantial growth can be expected.

REFERENCE SIGNS LIST 1 joining base material
2 intermediate layer coating
3 anchor forming material
4 primary metal layer
5 secondary metal layer

The invention claimed is:

1. A joined body of a joining base material and a metal layer, the metal layer being joined to a joint surface of the joining base material via an intermediate layer coating, wherein
the joining base material is a ceramic base material,
the intermediate layer coating is oxide glass produced by melting a compound of one or two or more kinds of metal components,
in the intermediate layer coating, an anchor forming material that forms an anchor for joining the metal layer by an anchor effect is dispersed and embedded, and the intermediate layer coating is fused to the joint surface of the joining base material,
the embedded anchor forming material partially protrudes outward from the intermediate layer coating, and is fused to the intermediate layer coating,
the metal layer has a structure in which a primary metal layer is formed on the intermediate layer coating, and a secondary metal layer is formed on the primary metal layer,
the anchor forming material has a diameter of 0.1 to 30 μm,
the anchor forming material has a spherical, angular, or polygonal shape, and the anchor forming material is dispersed and embedded in a fibrous or mesh form having a three-dimensional structure in which a plurality of the anchor forming materials are bonded to each other,
the primary metal layer fills a gap between the anchor forming materials protruding outward from a surface of the intermediate layer coating, surrounds protrusions of the anchor forming materials, and is joined to the surface of the intermediate layer coating.

2. The joined body of a joining base material and a metal layer according to claim 1, wherein the anchor forming material is one kind or a mixture of two or more kinds of oxide powder, carbide powder, nitride powder, boride powder, silicide powder, diatomaceous earth powder, silica gel powder, glass powder, diamond powder, DLC powder, ceramic powder, porcelain powder, silica fiber powder, ceramic fibers, mica powder, graphite powder, kaolin powder, fibers, and whiskers.

3. The joined body of a joining base material and a metal layer according to claim 1, wherein the joining base material is any of $Al_2O_3$, AlN, $Si_3N_4$, BN, SiC, ZrC, WC, DLC, sapphire, porcelain, GaC, GaN, and GaO.

4. The joined body of a joining base material and a metal layer according to claim 1, wherein the joining base material has any of a plate shape, a column shape, a spherical shape, a cylindrical shape, or a bar shape.

5. The joined body of a joining base material and a metal layer according to claim 1, wherein a coating metal of the primary metal layer includes one or two or more kinds of metals.

6. The joined body of a joining base material and a metal layer according to claim 1, wherein the primary metal layer has a thickness of 0.001 to 10 μm.

7. The joined body of a joining base material and a metal layer according to claim 1, wherein a coating metal of the secondary metal layer is a laminate of one or two or more kinds of metals, or an alloy of two or more kinds of metals.

8. The joined body of a joining base material and a metal layer according to claim 1, wherein the secondary metal layer has a thickness of 0.1 μm to 10 cm.

9. The joined body of a joining base material and a metal layer according to claim 1, wherein the joining base material is a ceramic substrate, and one of a circuit and a pad or both are formed on the ceramic substrate that is the joining base material.

10. The joined body of a joining base material and a metal layer according to claim 9, wherein a surface of the secondary metal layer in one of the circuit and the pad or both is plated with any of Ni, Sn, Pd, Ag, Au, Pt, Pb, Ni/Pd/Au, Ni/Sn, Ni—Sn—Ag—Cu, Sn—Bi, and Sn—Cu.

11. The joined body of a joining base material and a metal layer according to claim 1, wherein an electronic component is joined to and mounted on the metal layer.

* * * * *